(12) United States Patent
Ramanathan et al.

(10) Patent No.: US 7,214,605 B2
(45) Date of Patent: May 8, 2007

(54) DEPOSITION OF DIFFUSION BARRIER

(75) Inventors: Shriram Ramanathan, Hillsboro, OR (US); Grant Kloster, Lake Oswego, OR (US); Patrick Morrow, Portland, OR (US); Vijayakumar RamachandraRao, Hillsboro, OR (US); Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 10/683,202

(22) Filed: Oct. 9, 2003

(65) Prior Publication Data

US 2005/0079685 A1    Apr. 14, 2005

(51) Int. Cl.
H01L 21/44    (2006.01)
(52) U.S. Cl. ............... 438/614; 257/E21.508
(58) Field of Classification Search ........ 438/106–107, 438/109, 118–119, 128–129, 597–599, 612–614, 438/618, 620, 627–628, 643, 648, 653, 656, 438/666–667, 674, 678–680, 685, 687, 108, 438/110–114, 127, 197, 199, 206, 212, 229, 438/231–234, 262, 299, 301, 305–306, 455, 438/458–460, 464–465, 584–586, 588, 622
See application file for complete search history.

(56) References Cited

U.S. PATENT DOCUMENTS

| | | | |
|---|---|---|---|
| 5,923,539 A * | 7/1999 | Matsui et al. ............... 361/777 |
| 5,935,430 A * | 8/1999 | Craig ....................... 210/198.2 |
| 6,406,636 B1 * | 6/2002 | Vaganov ......................... 216/2 |
| 6,661,085 B2 * | 12/2003 | Kellar et al. ................ 257/686 |
| 6,667,225 B2 * | 12/2003 | Hau-Riege et al. ......... 438/462 |
| 6,762,076 B2 | 7/2004 | Kim et al. |
| 6,794,288 B1 * | 9/2004 | Kolics et al. ............... 438/678 |
| 6,812,132 B2 | 11/2004 | Ramachandrarao et al. |
| 6,897,125 B2 | 5/2005 | Morrow et al. |
| 6,930,391 B2 | 8/2005 | Kloster et al. |
| 6,946,384 B2 | 9/2005 | Kloster et al. |
| 2002/0126459 A1 * | 9/2002 | Albert et al. ................ 361/743 |
| 2003/0054626 A1 * | 3/2003 | Kobayashi et al. ......... 438/612 |
| 2003/0148590 A1 * | 8/2003 | Kellar et al. ................ 438/455 |
| 2004/0014308 A1 * | 1/2004 | Kellar et al. ................ 438/612 |
| 2005/0003650 A1 * | 1/2005 | Ramanathan et al. ....... 438/614 |
| 2005/0194695 A1 * | 9/2005 | Lin et al. .................... 257/777 |
| 2006/0030081 A1 * | 2/2006 | Connell et al. ............. 438/126 |

* cited by examiner

*Primary Examiner*—Michael Lebentritt
*Assistant Examiner*—Andre' Stevenson
(74) *Attorney, Agent, or Firm*—Kathy J. Ortiz

(57) ABSTRACT

The invention provides a stacked wafer structure with decreased failures. In one embodiment, there is a barrier layer deposited on exposed surfaces of conductors that extend across a distance between first and second device structures. The barrier layer may prevent diffusion and electromigration of the conductor material, which may decrease incidences of shorts and voids in the stacked wafer structure.

8 Claims, 6 Drawing Sheets

DEPOSITION OF DIFFUSION BARRIER

BACKGROUND

1. Field of the Invention

This invention relates to stacked wafer integrated circuits, and more particularly to use of a barrier layer on patterned connecting structures to prevent diffusion and electromigration.

2. Background of the Invention

Stacked integrated circuits have conductors extending between bonded wafers. These conductors can have exposed surfaces which can lead to reliability problems. FIG. 1 is a side cross section view of an example conventional stacked integrated circuit 100 that illustrates such problems. The stacked integrated circuit 100 has a first device structure 102. The first device structure 102 includes a substrate layer 104 and an oxide layer 106. Copper conductors 108 extend from the oxide layer 106 of the first device structure 102 to a second device structure 110. The conductors 108 have exposed surfaces 112 because the first and second device structures 102, 110 are spaced a distance 114 apart. Because the conductors 108 have exposed surfaces 112, and because copper can diffuse through oxide easily, issues such as copper diffusion and electromigration may occur. This can lead to shorting of the stacked integrated circuit 100 or voids in the conductors 108. Either of these problems can cause the stacked integrated circuit 100 to malfunction.

BRIEF DESCRIPTION OF THE DRAWINGS

The various embodiments of the invention are illustrated by way of example and not by way of limitation in the figures of the accompanying drawings, in which like references indicate similar elements and in which.

DETAILED DESCRIPTION

Figure 1:
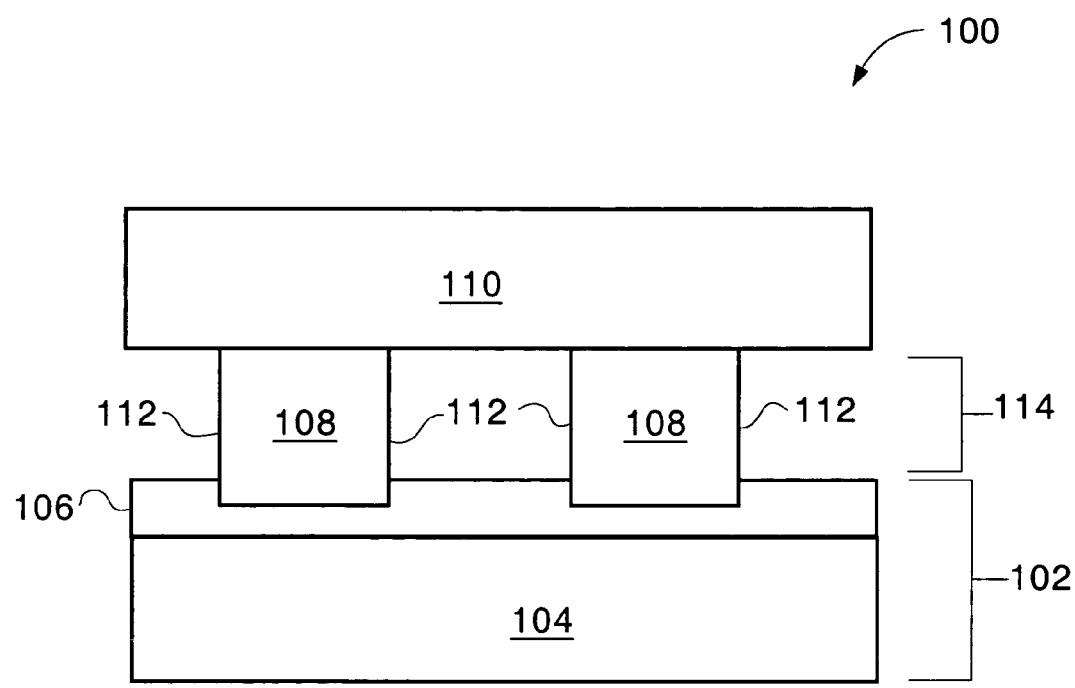
FIG. 1 is a side cross section view of an example conventional stacked integrated circuit that illustrates reliability problems.
Figure 2:
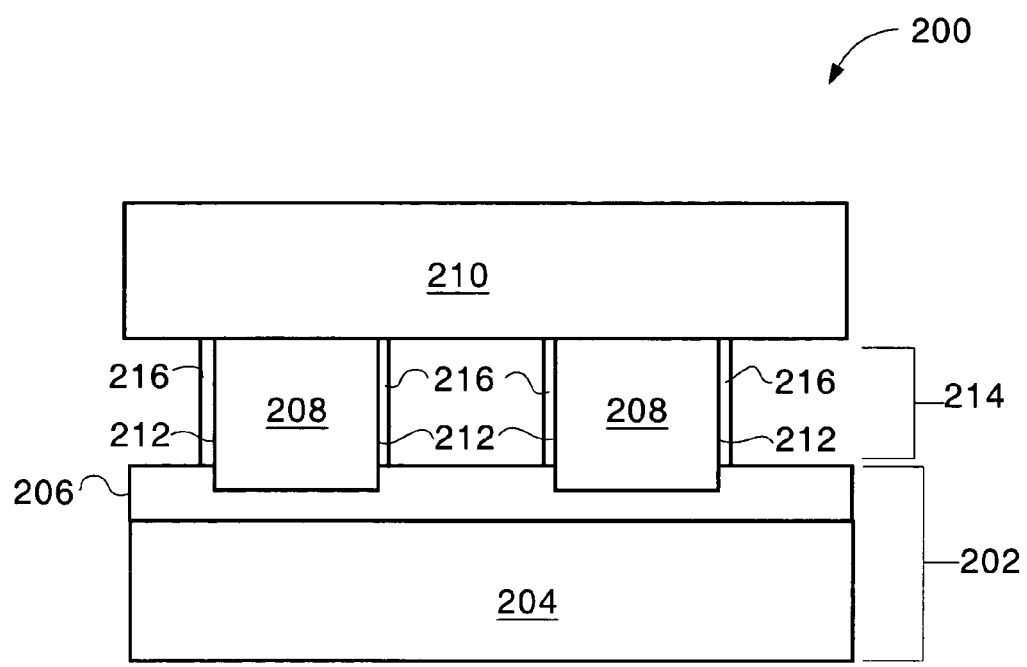
FIG. 2 is a side cross section view of an embodiment of a stacked integrated circuit according to one embodiment of the present invention.

FIG. 2 is a side cross section view of an embodiment of a stacked integrated circuit 200 according to one embodiment of the present invention. The stacked integrated circuit 200 may include a first device structure 202. The first device structure 202 may be an integrated circuit that includes one or more layers, which may include patterned materials and devices in various embodiments. In an embodiment, the first device structure 202 may include a substrate layer 204 and an oxide layer 206 formed over the substrate layer 204. In the illustrated embodiment, the oxide layer 206 is at a top surface of the first device structure 202.

Patterned conductors 208 may be formed connected to the first device structure 202, and may be considered as part of the first device structure 202 or separate from the first device structure 202. In an embodiment, these conductors 208 may be copper pillars that extend above the top surface of the first device structure 202, and also extend below the top surface of the first device structure 202 into the oxide layer 206. In other embodiments, the conductors 208 may extend from the top surface of the first device structure 202 without extending into the oxide layer 206, may be located differently, be different shapes, and/or made from different materials.

A second device structure 210 may be bonded to the conductors 208. The second device structure 210 may be an integrated circuit that includes one or multiple layers, which may include patterned materials and devices in various embodiments. The second device structure 210 may have conductors 208 that extend from the second device structure 210. These conductors 208 extending from the second device structure 210 may be considered as part of the second device structure 210 or separate from the second device structure 210.

The first and second device structures 202, 210 may be connected by the conductors 208, structurally and/or electrically. The conductors 208 also space the first and second device structures 202, 210 a distance 214 apart. This distance 214 means there is a gap between the first and second device structures 202, 210. The conductors 208 cross this gap. The distance 214 between the first and second device structures 202, 210 may range from about 50 nm to about 500 nm. Both the first and second device structures 202, 210 may have conductors extending from the respective device structures 202, 210. The conductors 208 of the first device structure 202 may be bonded to conductors 208 of the second device structure 210 to connect the first and second device structures 202, 210. Other ways to connect the first and second device structures 202, 210 may also be used.

The conductors 208 may have surfaces 212 that extend between the first and second device layers 202, 210. There may be a barrier layer 216 that substantially covers the surfaces 212 of the conductors 208. The barrier layer 216 may be a layer of cobalt, or other materials may also be used. This barrier layer 216 substantially prevents the surfaces 212 of the conductors 208 from being exposed in the distance 214 between the first and second device structures 202, 210. While in an embodiment, the conductors 208 are a copper to copper bonded structure, the conductors 208 may also be a copper to tin bonded structure, a silicon-to-gallium arsenide bonded structure, or another structure that would otherwise be exposed without the barrier layer 216. The barrier layer 216 acts as a diffusion barrier.

The stacked integrated circuit 200 of FIG. 2 may be connected to other devices. For example, the stacked integrated circuit 200 may be packaged and connected to a circuit board. The circuit board may connect the stacked integrated circuit 200 to other components. The stacked integrated circuit 200, circuit board, and other components may together form a computer system, with input and output devices, a processor, and memory.

Figure 3:
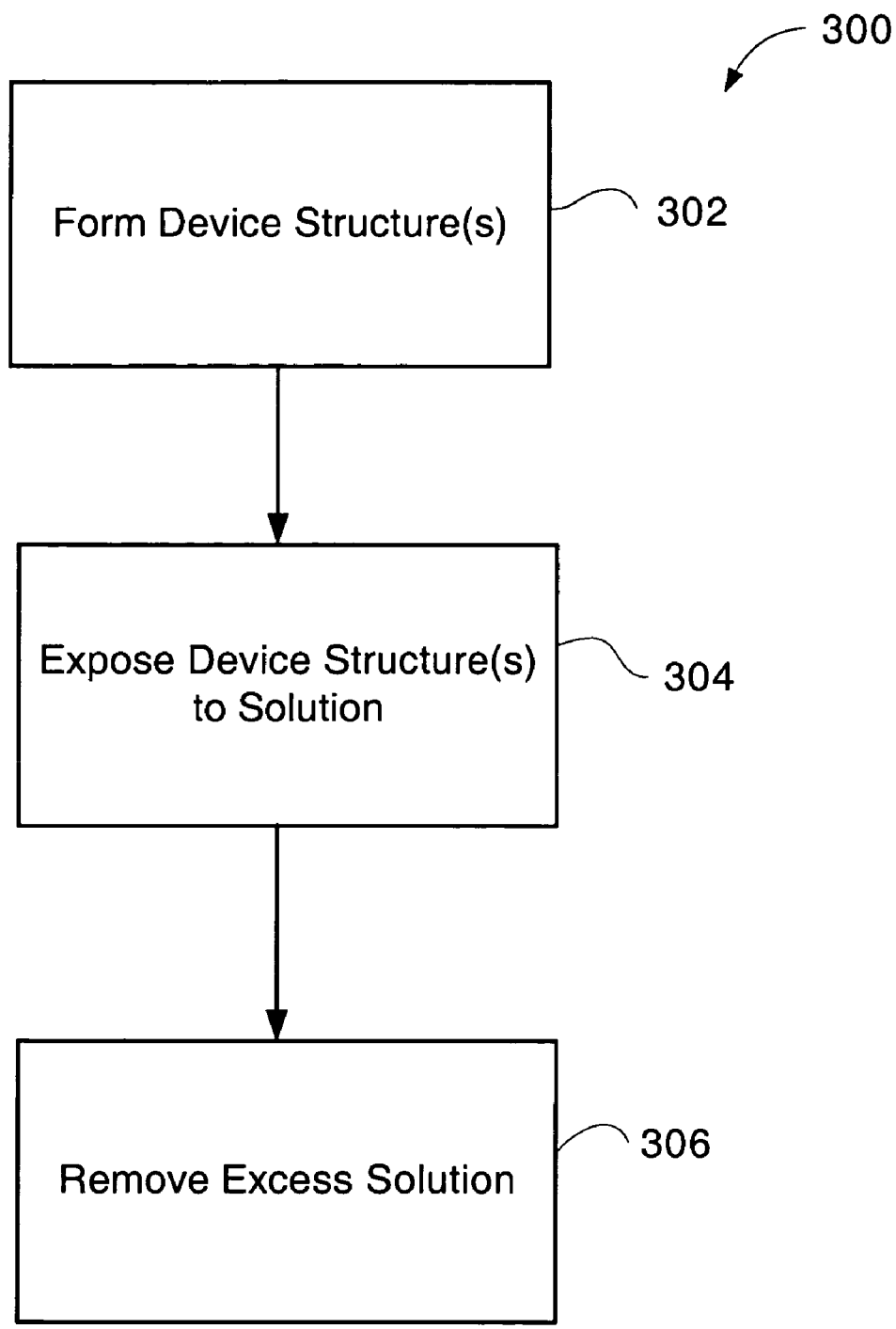
FIG. 3 is a flow chart that illustrates how the barrier layer may be formed according to one embodiment.
Figure 4:
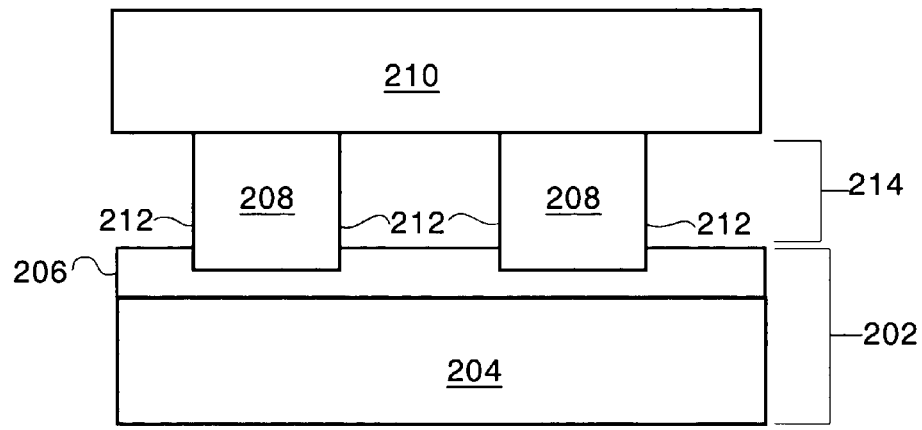
FIG. 4 shows two device structures connected together by conductors.

FIG. 3 is a flow chart 300 that illustrates how the barrier layer 216 may be formed according to one embodiment. One or more of the device structures, such as the first or second device structures 202, 210, are formed 302. Referring now to FIG. 4, a cross section view of formed 302 device structures 202, 210 is illustrated. FIG. 4 shows two device structures 202, 210 connected together by conductors 208.

In other embodiments, a single device structure 202 or 210 with conductors 208 extending from the device structure 202 or 210 may be formed 302. As seen in FIG. 4, the conductors 208 have exposed surfaces 212 in the distance 214 between the device structures 202, 210.

Returning to FIG. 3, the one or more conductors 208 between the device structures may be exposed 304 to a solution. This solution may contain one or more materials (cobalt in one embodiment) that may form the barrier layer 216. When exposed to the solution, materials in the solution may be deposited on the conductors 208 to form the barrier layer 216. In an embodiment, the solution may be an electroless plating bath and the materials deposited on the conductors 208 via electroless plating. Such a bath may include cobalt ions in embodiments where the barrier layer 216 comprises cobalt. With such cobalt-containing solutions, the cobalt within the solution may be selectively deposited on the surfaces 212 of the conductors 208, such as exposed copper conductor 208 surfaces 212, by electroless deposition to form the barrier layer 216.

Figure 5:
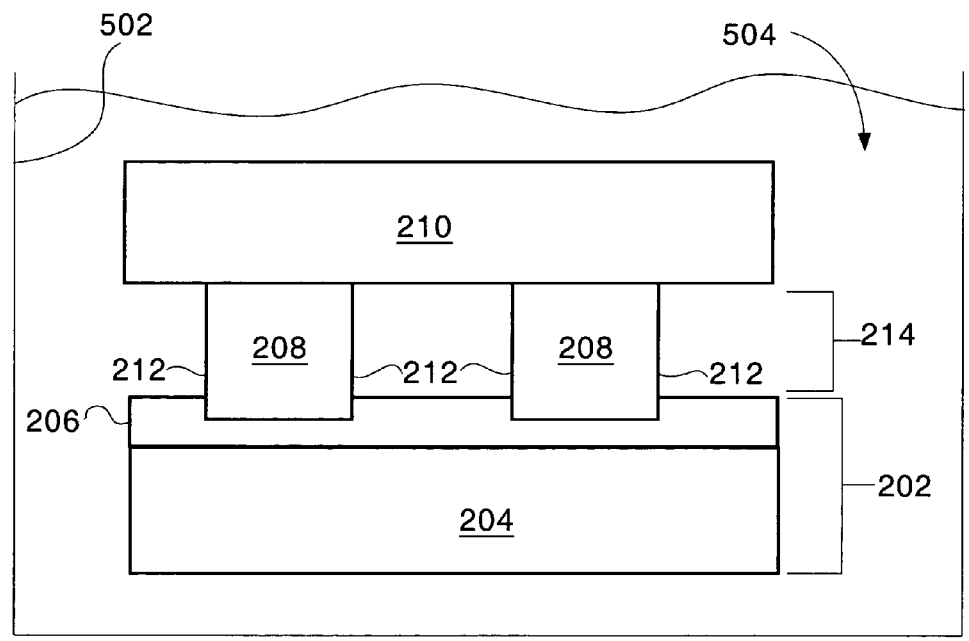
FIG. 5 illustrates one way in which a device structure may be exposed to a solution.

Referring now to FIG. 5, one way in which the conductors 208 of one or more device structures may be exposed 304 to a solution is illustrated. In FIG. 5, a container 502 contains solution 504. Device structures 202 and 210 may be dipped partially or completely into the solution 504 in the container. The solution 504 may then come into contact with the surfaces 212 of the conductors 208 so that cobalt or another material in the solution 504 may be deposited on the conductors 208 to form the barrier layers 216 shown in FIG. 2. Capillary action or pressure may aid the solution in reaching the surfaces 212 of the conductors 208.

Figure 6:
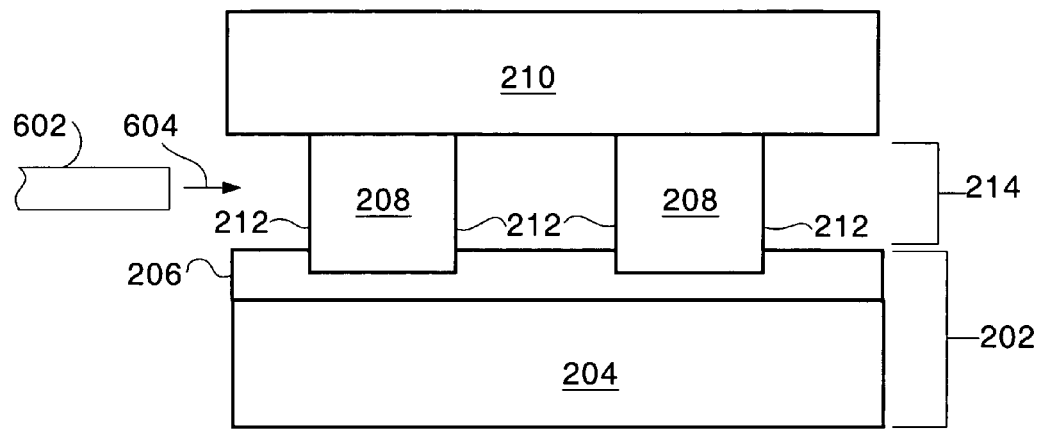
FIG. 6 illustrates another way in which a device structure may be exposed to a solution.

Referring now to FIG. 6, another way in which the conductors 208 of one or more device structures may be exposed 304 to a solution is illustrated. In FIG. 6, a syringe 602 is used to apply solution 604 near the surfaces 212 of the conductors 208. A syringe 602 may be a device that is capable of applying solution at a selected position. This selected position may be a position near the surfaces 212 of the conductors 208, so that the solution may come into contact with the surfaces 212 to form the barrier layer 216 on the surfaces. Use of such a syringe 602 may be useful, for example, if the distance 214 between the first and second device structures 202, 210 is so small that the solution might not reach the surfaces 212 when using the exposure method illustrated in FIG. 5.

Figure 7:
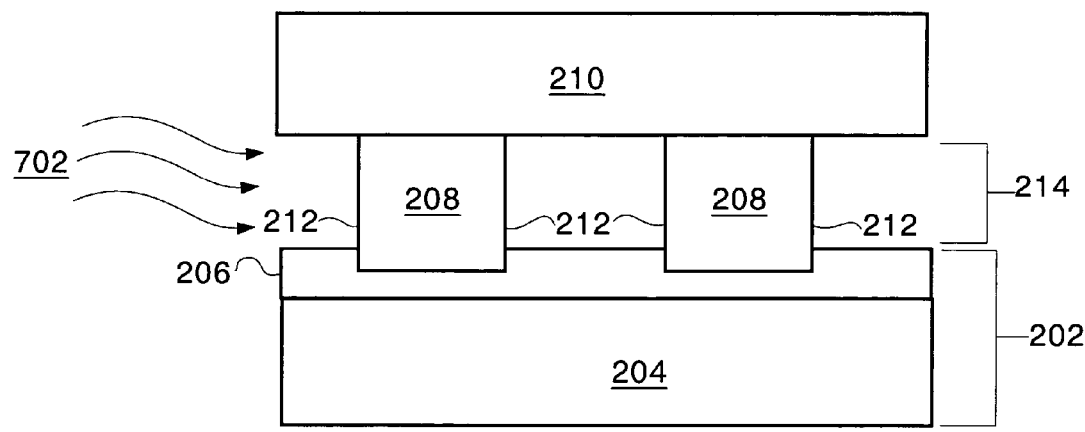
FIG. 7 illustrates yet another way in which a device structure may be exposed to a solution.

Referring now to FIG. 7, yet another way in which the conductors 208 of one or more device structures may be exposed 304 to a solution is illustrated. In FIG. 7, supercritical $CO_2$ 702 may be used to carry the solution to the surfaces 212 of the conductors 208. The solution itself may be in an aerosol form and carried to the surfaces 212 by the supercritical $CO_2$ 702 flowing to the surfaces 212, or may be in another form to be brought to the surfaces by the supercritical $CO_2$ 702. The supercritical $CO_2$ 702 can penetrate small spaces and may be useful, for example, if the distance 214 between the first and second device structures 202, 210 is so small that the solution might not reach the surfaces 212 when using the exposure method illustrated in FIG. 5. Other methods to expose 304 the surfaces 212 of the conductors 208 of device structures 202, 210 to the solution, such a flow of substances different from supercritical $CO_2$ 702 carrying the solution, may also be used.

Returning to FIG. 3, excess solution may be removed 306. This may happen after the barrier layer 216 has been formed. A flow of gas or liquid past the device structures 202, 210 may be used to remove 306 excess solution. For example, a flow of supercritical $CO_2$ may be used to remove 306 excess solution. Other methods may be used as well.

Figure 8A:
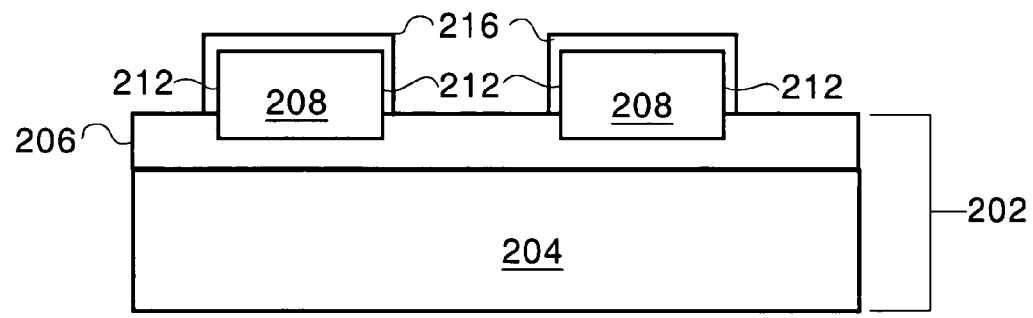
FIGS. 8a and 8b are cross section side views of first and second device structures illustrating how the barrier layer may be applied to surfaces of the conductors prior to bonding the first and second device structures together.
Figure 8B:
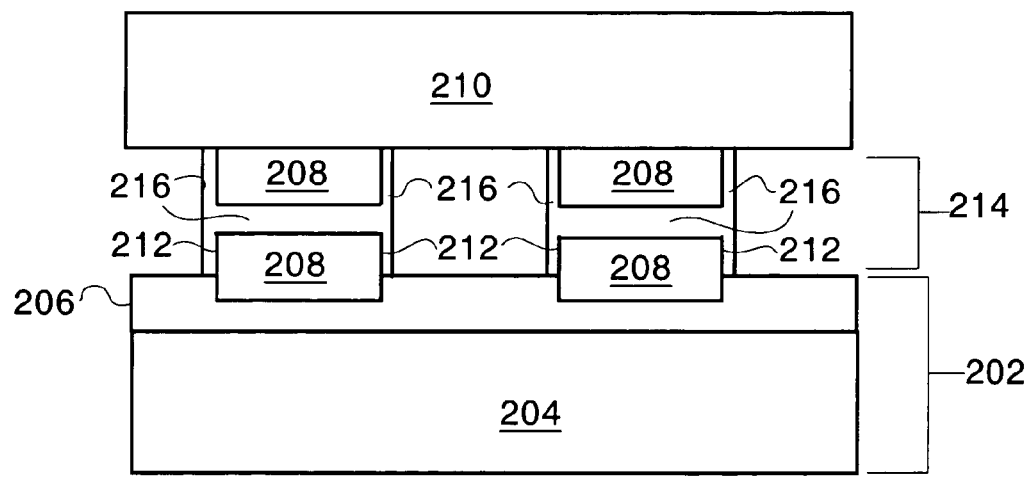

FIGS. 8a and 8b are cross section side views of first and second device structures 202, 210 illustrating how the barrier layer 216 may be applied to surfaces 212 of the conductors 208 prior to bonding the first and second device structures 202, 210 together. FIG. 8a is a cross section side view that illustrates a first device structure 202 that is not bonded to the second device structure 210. The barrier layer 216 has been formed on the conductors 208 of the first device structure 202, so that the surfaces 212 of the conductors 208 are substantially covered. The barrier layer 216 may be formed as described with respect to FIGS. 3 through 7, above. A barrier layer 216 may similarly be formed on conductors 208 of a second device structure 210 as well. FIG. 8b is a cross section side view that illustrates the first and second device structures 202, 210 bonded together, where the barrier layer 216 has been formed on the conductors of one or both of the first and second device structures 202, 210 prior to bonding. In such a case, there may be part of the barrier layer 216 between the conductors 208 of the first and second device structures 202, 210. Alternatively, the barrier layer 216 may be removed from part of the conductor 208 prior to bonding.

The foregoing description of the embodiments of the invention has been presented for the purposes of illustration and description. It is not intended to be exhaustive or to limit the invention to the precise forms disclosed. This description and the claims following include terms, such as left, right, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method, comprising:

forming a first device structure with patterned conductors;

depositing a barrier layer on exposed surfaces of the patterned conductors wherein depositing a barrier layer comprises exposing the exposed surfaces of the patterned conductors to a solution;

bonding the first device structure to a second device structure;

wherein the first device structure is bonded to the second device structure prior to depositing the barrier layer on exposed portions of the patterned conductors; and wherein the solution comprises cobalt ions and the barrier layer comprises cobalt.

2. The method of claim 1, wherein exposing the exposed portions of the patterned conductors to a solution comprises dipping the first device structure at least partially into the solution.

3. The method of claim 1, wherein exposing the exposed portions of the patterned conductors to a solution comprises applying solution with a syringe.

4. The method of claim 1, wherein exposing the exposed portions of the patterned conductors to a solution comprises flowing the solution to the conductors in aerosol form carried by supercritical $CO_2$.

5. The method of claim 1, further comprising removing excess solution.

6. The method of claim 1, wherein the patterned conductors are copper and the barrier layer is selectively deposited on the conductors by electroless deposition.

7. A method comprising:
  forming a first device structure with conductors extending beyond a surface of the first device structure, wherein the conductors comprise copper;
  forming a second device structure;
  bonding the first device structure to the second device structure so that the conductors have exposed surfaces in a gap between the first device structure and the second device structure; and
  forming a barrier layer on substantially all the exposed surfaces of the conductors after bonding the first device structure to the second device structure, wherein forming the barrier layer comprises exposing the exposed surfaces of the conductors to a solution to form the barrier layer and wherein the solution comprises cobalt ions and the barrier layer comprises cobalt.

8. The method of claim 7, wherein the barrier layer is formed by selectively depositing the barrier layer on the conductors by electroless deposition.

* * * * *